United States Patent [19]

Nakamura

[11] Patent Number: 5,198,751
[45] Date of Patent: Mar. 30, 1993

[54] REACTIVE VOLT-AMPERE-HOUR METER

[75] Inventor: Hidetake Nakamura, Tokyo, Japan

[73] Assignees: NEC Corporation; The Tokyo Electric Power Company Incorporated, both of Japan

[21] Appl. No.: 855,288

[22] Filed: Mar. 23, 1992

[30] Foreign Application Priority Data

Mar. 22, 1991 [JP] Japan ................................. 3-81200

[51] Int. Cl.$^5$ ..................... G01R 21/00; G01R 22/00; G01R 21/06
[52] U.S. Cl. ................................. 324/141; 324/142; 364/483; 364/492; 377/44
[58] Field of Search ................... 324/141, 142, 103 R, 324/107, 83 D, 83 Q; 364/483, 492; 377/44, 45

[56] References Cited

U.S. PATENT DOCUMENTS

| 4,229,795 | 10/1980 | Vieweg et al. | 377/44 |
| 4,250,449 | 2/1981 | Shum | 324/142 |
| 4,589,052 | 5/1986 | Dougherty | 364/483 |
| 4,884,021 | 11/1989 | Hammond et al. | 324/141 |
| 4,992,725 | 2/1991 | Komatsu et al. | |
| 5,059,896 | 10/1991 | Germer et al. | 324/142 |
| 5,122,735 | 6/1992 | Porter et al. | 364/483 |

OTHER PUBLICATIONS

"uD4192B, 4193B, Presettable Up/Down Counter", NEC Corp., pp. 770, 771, 774, 775; Jun. 1988.

Primary Examiner—Ernest F. Karlsen
Assistant Examiner—William J. Burns
Attorney, Agent, or Firm—Laff, Whitesel, Conte & Saret

[57] ABSTRACT

In a reactive volt-ampere-hour meter, either of a pair of electric signals representative of, respectively, an AC voltage and an AC current fed to a load has the phase thereof shifted by 90 degrees to produce a signal representation of a product of the two signals. A cumulative adder cumulates the resulting product signals. A first carry pulse and a borrow pulse are generated in the event of, respectively, an overflow and an underflow during cumulation and are fed to a first and a second up-down counter, respectively. The first up-down counter up-counts the first carry pulses and down-counts the borrow pulses and generates a second carry pulse when an overflow occurs. The second up-down counter up-counts the borrow pulses and down-counts the first carry pulses and generates a third carry pulse in the event of an overflow. An up-counter up-counts the second and third carry pulses from the first and second up-down counters, respectively. The count of the up-counter is representative of the result of cumulation of the absolute values of reactive power, i.e., the amount of reactive power.

6 Claims, 4 Drawing Sheets

REACTIVE VOLT-AMPERE-HOUR METER

BACKGROUND OF THE INVENTION

1. Field of the Invention

The present invention relates to a reactive volt-ampere-hour meter and, more particularly, to a reactive volt-ampere-hour meter of the type electronically measuring the amount of reactive power of loads for AC applications.

2. Description of the Prior Art

Energy charge for home appliances is computed on the basis of active power indicated by an integrating wattmeter. However, when it comes to factories and other large users using many electric appliances including motors, it is necessary to measure not only the active power but also reactive power of such loads in computing energy charge. Specifically, it is a common practice to apply a so-called force rate article prescribing that the charge should be discounted when the force rate of loads is higher than a standard value or should be increased if the former is lower than the latter. For example, assuming that he standard force rate is 85 percent, the basic charge is discounted by 1 percent per 1 percent of the part exceeding 85 percent or should be increased by 1 percent per 1 percent of the part falling short of 85 percent. A large user, therefore, has to be furnished with a reactive volt-ampere-hour meter in addition to an integrating wattmeter, so that the reactive power of AC loads may be measured throughout the period in which power is used.

An integrating wattmeter for measuring active power is decreasing in size due to electronic implementations. For example, U.S. Pat. No. 4,992,725 issued to the same inventor as the present invention discloses a wattmeter having a pair of analog-to-digital (A/D) converters for converting respectively two analog signals representative of an AC voltage and an AC current fed to an AC load to digital signals, a multiplier for multiplying the digital signals, and an integrating unit for integrating the results of multiplications. The integrated value of the integrating unit indicates a measured amount of active power.

Theoretically, if a 90-degrees phase shift circuit precedes either of the two A/D converters of such an integrating wattmeter for shifting the phase of the input analog signal by 90 degrees, the integrated value of the integrating unit is expected to give the amount of reactive power of a load and, therefore, to readily implement a reactive volt-ampere-hour meter. However, this approach is not practical since the phase of a current to a load relative to the phase of a voltage changes with the connection of electrical equipment to be used and with the size of a load. Specifically, when the phase of a current to a load is retarded relative to the phase of a voltage (simply referred to as a retarded phase hereinafter), the meter integrates reactive power in the positive direction. Conversely, when the former is advanced relative to the latter (simply referred to as an advanced phase hereinafter), the meter integrates reactive power in the negative direction. Therefore, when use is made of only one reactive volt-ampere-hour meter having the above construction for measuring the amount of reactive power, a difference between the value integrated during the period of retarded phase and the value integrated during the period of advanced phase will be the result of measurement due to the retarded phase and advanced phase. Then, the output of the meter will be smaller than the actual value, resulting in the overestimation of the force ratio of the load.

In light of the above, it has been customary to connect two reactive volt-ampere-hour meters to the same load in parallel and assign one of them to retarded phase and the other to advanced phase. The absolute values of the results of measurement by the two meters are added to produce an actual amount of reactive power. In such a case, use is made of a reactive volt-ampere-hour meter of the type having an integrating unit made up of a cumulative adder, an up-down counter, and an up-counter and connected to the output terminal of the multiplier in place of the previously stated integrating unit which simply integrates the products from the multiplier. The cumulative adder has a predetermined number of figures and cumulatively adds products from the multiplier to produce a single carry pulse every time a positive overflow occurs or to produce a single borrow pulse every time a negative overflow occurs. The up-down counter up-counts the carry pulses from the cumulative adder and down-counts the borrow pulses to generate a single carry pulse every time a positive overflow occurs. The up-counter up-counts the carry pulses from the up-down counter. The number of carry pulses from the cumulative adder becomes greater than that of the borrow pulses when the amount of power is positive or becomes smaller than the latter when the amount of power is negative. The up-down counter up-counting the carry pulses and down-counting the borrow pulses generates carry pulses the number of which is proportional to the amount of power only when the amount is positive. Therefore, the count of the up-down counter indicates the positive amount of power. One of the two meters each being responsive to the positive amount of power only is provided with a 90-degrees phase shift circuit for shifting the phase of an analog signal representative of an AC current by 90 degrees, implementing a reactive volt-ampere-hour meter for advanced phase. The other meter is provided with a 90-degrees phase shift circuit for shifting the phase of an analog signal representative of an AC voltage by 90 degrees, constituting a reactive volt-ampere-hour meter for retarded phase. Since the former meter and the latter meter measure respectively only the amount of reactive power during the period of advanced phase and only the amount of reactive power during the period of retarded phase, adding the outputs of the two meters is successful in producing an actual amount of reactive power.

However, the dual reactive volt-ampere-hour meter scheme stated above is not desirable from the cost performance standpoint since it needs not only two such meters but also means for adding the outputs of the two meters.

BRIEF SUMMARY OF THE INVENTION

Object of the Invention

It is, therefore, an object of the present invention to provide a reactive volt-ampere-hour meter capable of measuring the amount of reactive power of an AC load accurately with no regard to the advancement/retardation of the phase of a current relative to the that of a voltage.

Summary of the Invention

A reactive volt-ampere-hour meter of the present invention comprises a 90-degrees phase shift circuit for receiving a first and a second electric signal representative of, respectively, an AC voltage and an AC current fed to a load and generating a pair of electric signals by shifting the phase of either of the first and second electric signals by 90 degrees, a multiplier for multiplying the pair of electric signals to thereby produce a third electric signal representative of a product of the pair of electric signals, a cumulative adder for cumulatively adding the third electric signals and generating a first carry pulse when the cumulative sum reaches a predetermined upper limit or generating a borrow pulse when the cumulative sum reaches a predetermined lower limit, a first up-down counter for up-counting the first carry pulses and down-counting the borrow pulses to generate a second carry pulse when the count of the first up-down counter reaches a predetermined value, a second up-down counter for up-counting the borrow pulses and down-counting the first carry pulses to generate a third carry pulse when the count of the second up-down counter reaches a predetermined value, an up-counter for up-counting the second and third carry pulses, and a display for displaying the count of the up-counter.

In the above construction, either of the first and second up-down counters produces, whether the AC current be advanced or retarded in phase relative to the AC voltage, carry pulses the number of which is proportional to the absolute value of the amount of reactive power. By up-counting such carry pulses, it is possible to measure the amount of reactive power accurately by a single reactive volt-ampere-hour meter with no regard to the advancement/retardation of phase.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
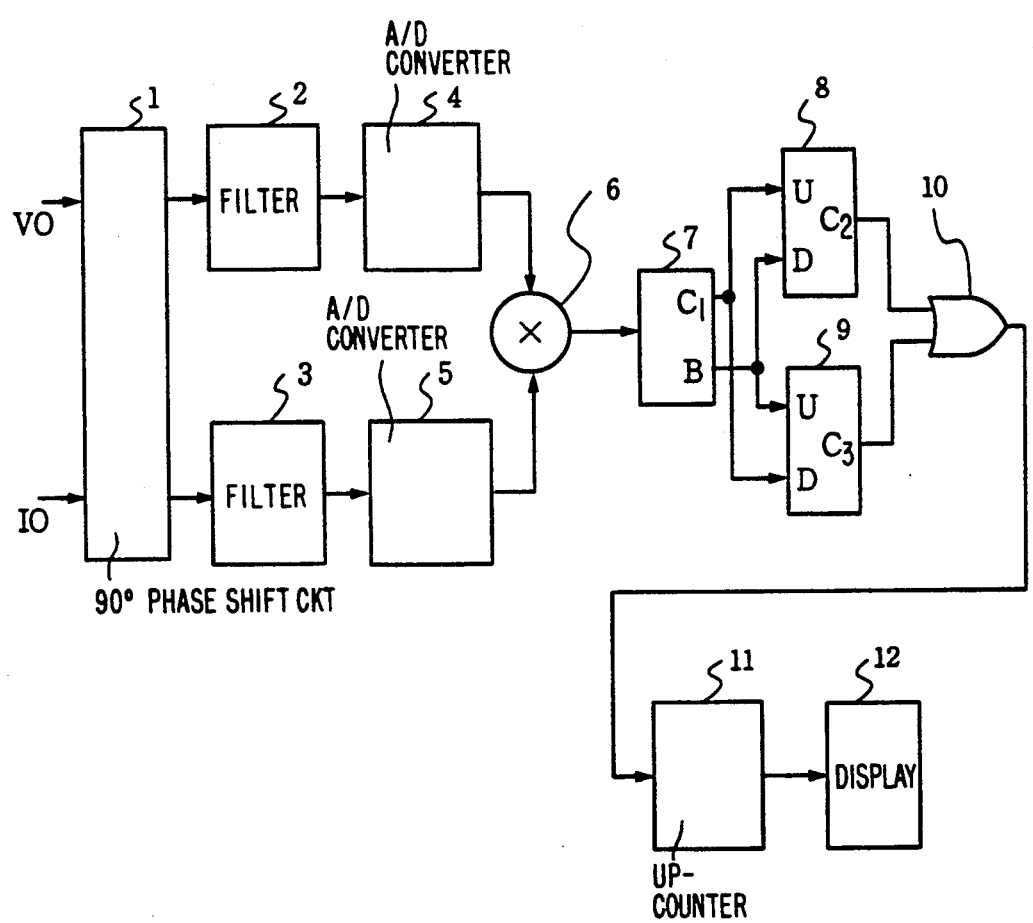
FIG. 1 is a block diagram schematically showing a reactive volt-ampere-hour meter embodying the present invention.

Referring to FIG. 1 of the drawings, a reactive volt-ampere-hour meter embodying the present invention is shown and includes a 90° phase shift circuit 1. A voltage transformer, not shown, and a current transformer, not shown, are connected to an AC load, not shown, and generate respectively a pair of analog signals V and I representative of an AC voltage and an AC current applied to the load. As the analog signals V and I are applied to the input terminals of the 90° phase shift circuit 1, the circuit 1 shifts the phase of either of the signals V and I by 90 degrees. Filters 2 and 3 are each connected to one of two output terminals of the 90° phase shift circuit 1 to remove needless frequency components from the associated output signal of the circuit 1. Analog-to-digital (A/D) converters 4 and 5 convert respectively the output signals of the filters 2 and 3 to digital signals. A multiplier 6 multiplies the digital signals fed thereto from the A/D converters 4 and 5. A cumulative adder 7 has a predetermined number of figures and cumulatively adds the products from the multiplier 6. The cumulative adder 7 outputs a single carry pulse C1 every time a positive overflow occurs and outputs a single borrow pulse B every time a negative overflow occurs. An up-down counter 8 up-counts the carry pulses C1 from the cumulative adder 7 and down-counts the borrow pulses B, producing a single carry pulse C2 every time the count overflows in the positive direction. Another up-down counter 9 up-counts the borrow pulses B and down-counts the carry pulses C1, producing a single carry pulse C3 every time the count overflows in the positive direction. An OR gate 10 produces OR of the carry pulses C2 and C3 output by the up-down counters 8 and 9. An up-counter 11 up-counts ORs from the OR gate 10. A display 12 displays the count of the up-down counter 11 thereon.

Figure 2:
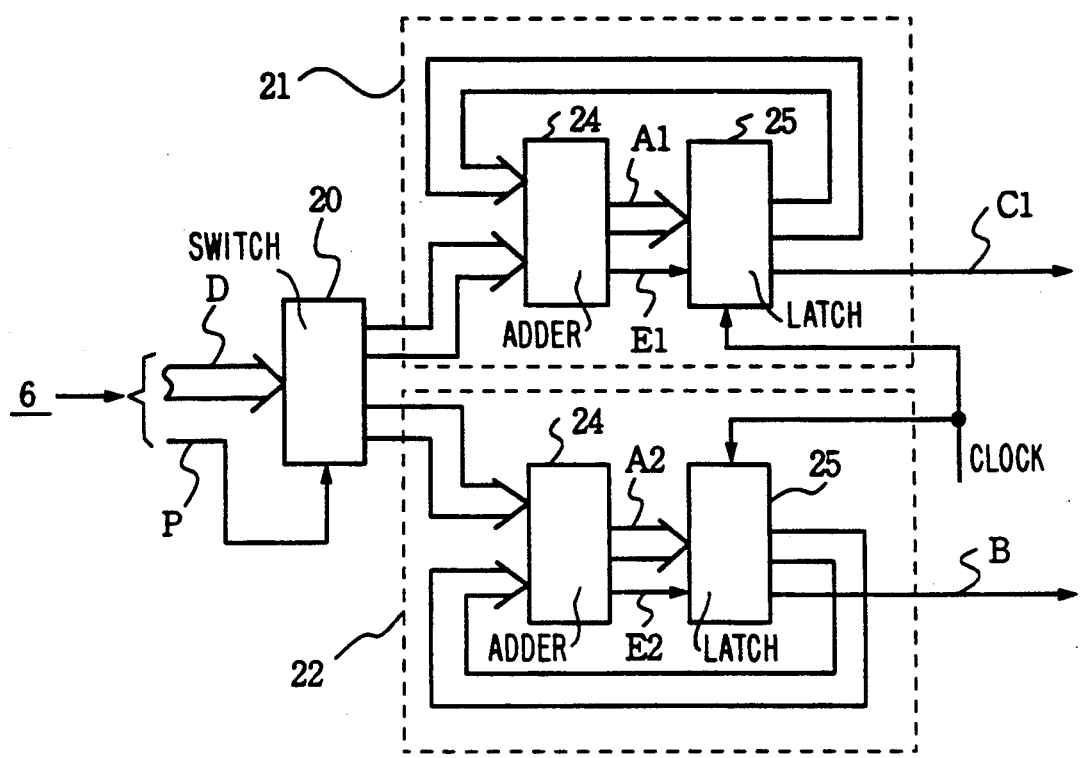
FIG. 2 is a block diagram schematically showing a specific construction of a cumulative adder included in the embodiment.

FIG. 2 shows a specific construction of the cumulative adder 7. As shown, a switch 20 receives from the multiplier 6 parallel digital signals consisting of a one-bit polarity bit P and numerical data D having a plurality of bits. The polarity bit P shows whether the product from the multiplier 6 is positive or negative while the numerical data D represents the absolute value of the product. The switch 20 connects the numerical data D to either of two output terminals thereof depending on the sign of the polarity bit P. Integrating units 21 and 22 cumulatively add respectively the numerical data from the two output terminals of the switch 20. When the polarity bit P is positive, the switch 20 connects the numerical data D to the integrating unit 21 while feeding numerical data representative of zero to the integrating unit 22. When the polarity bit P is negative, the switch 20 connects the numerical data D to the integrating unit 22 while feeding data representative of zero to the integrating unit 21.

The integrating units 21 and 22 each has an adder 24 and a latch 25. The adder 24 adds numerical data from the switch 20 and numerical data from the latch 25 and delivers to the associated latch circuit 25 numerical data A1 or A2 and a one-bit carry bit E1 or E2 in parallel. The numerical data A1 and A2 each indicates part of the resulting sum having the same number of bits as the numerical data D, as counted from the least significant bit, while each of the carry bits E1 and E2 shows whether or not an overflow from the above-mentioned part exists. The latch 25 latches the associated numerical data A1 or A2 and carry bit E1 or E2 in response to a clock which is synchronous to the timing clock of the input digital signals, i.e., polarity bit P and numerical data D. The numerical data A1 or A2 from the latch 25 is connected to the input terminal of the associated adder 24 while the carry bit E1 or E2 is fed out as the carry pulse C1 or the borrow pulse B.

While measurement is under way, the product output by the multiplier 6 indicates the instantaneous value of reactive power at the sampling timing of the A/D converters 4 and 5. The above-stated integrating unit 21 cumulatively adds, among the sequence of numerical data representative of the absolute values of the instantaneous values of reactive power, only the data whose polarity bits P are positive and generates a single carry pulse C1 very time an overflow occurs. The other integrating unit 22 cumulatively adds, among the sequence of numerical data D, only the data whose polarity bits P are negative and generates a single borrow pulse B every time an overflow occurs.

So long as the force ratio of the load being measured is exactly 100 percent, the instantaneous value of reactive power varies along a sinusoidal waveform with respect to time and, therefore, the cumulative adder 7 repetitively produces the same number of carry pulses C1 and borrow pulses B alternately. When the force ratio of the load is less than 100 percent, the instantaneous value of reactive power varies along a sinusoidal waveform on which a DC waveform is superposed. As a result, either of the carry pulses C1 and borrow pulses B becomes greater in number per unit time than the other depending on whether the phase is advanced or retarded. The difference between the number of the carry pulses C1 and that of the borrow pulses B is proportional to the absolute value of the amount of ractive power.

The up-down counters 8 and 9, FIG. 1, each comprises an ordinary up-down counter having a predetermined number of steps. Every time the count overflows in the positive direction, each of the counters 8 and 9 generates a single carry pulse C2 or C3 while resetting the count to zero. The overflow value of the up-down counters is determined by the number of steps thereof. In the illustrative embodiment, the up-down counters 8 and 9 are provided with such numbers of steps that the numbers of carry pulses C2 and C3 per unit time from the counters 8 and 9, respectively, are confined in an allowable range of measurement error, as determined by a repetitive experiment wherein only the sinusoidal wave component of the instantaneous value of the amount of reactive power was fed from the multiplier 6 to the cumulative adder 7. This is to reduce the numbers of carry pulses C2 and C3 from the counters 8 and 9 in association with the sinusoidal wave components included in the time-varying waveform of instantaneous values, thereby preventing ripple-like changes from appearing in the results of measurement.

During measurement, when the number carry pulses C1 per unit time from the cumulative adder 7 is greater than the number of borrow pulses B, the count of the up-down counter 8 sequentially increases with the result that carry pulses C2 appear in a number proportional to the absolute value of the amount of reactive power. During this period of time, the count of the up-down counter 9 sequentially decreases until the carry pulse C3 disappears. Conversely, when the number of borrow pulses B is greater than that of the carry pulses C1, the count of the up-down counter 9 sequentially increases to produce the number of pulses C3 proportional to the absolute value of the amount of reactive power. During this period of time, the up-down counter 8 does not produce any carry pulse C2.

The total number of carry pulses C2 and C3 fed from the up-down counters 8 and 9 to the up-counter 11 via the OR gate 10 is representative of, whether the phase of the signal I be advanced or retarded relative to that of the signal V, the cumulated value of the absolute values of the amounts of reactive power. Therefore, the count of the up-counter 11 can be indicated on the display 12 as the cumulated value of such absolute values.

In the embodiment shown in FIG. 1, the up-down counters 8 and 9 are each implemented by an ordinary up-down counter and, therefore, produces the carry pulse C2 or C3 only when an overflow occurs, even though the carry pulse C1 or the borrow pulse B may continuously arrive at the up-count input terminal U. It is likely, therefore, that the number of carry pulses C2 and C3 is smaller than the difference between the number of carry pulses C1 and that of the borrow pulses B from the cumulative adder 7, preventing the measurement from achieving desired accuracy. In light of this, the up-down counters 8 and 9 may each be implemented by a binary counter with a hysteresis characteristic, e.g., a binary counter 30 shown in FIG. 3.

Figure 3:
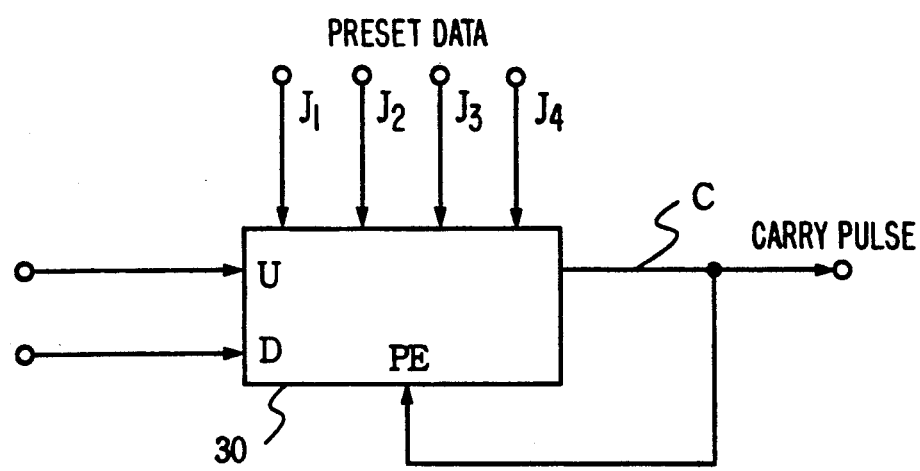
FIG. 3 is a block diagram schematically showing a specific construction of a binary counter also included in the embodiment.

The binary counter 30 shown in FIG. 3 is constituted by a four-bit data presettable up-down counter μPD4193BC available from NEC (Japan) (see, for example, "NEC CMOS Digital IC Data Book", 1987, pp. 223-229). The output terminal of the binary counter 30 is connected to a preset enable input terminal PE. The binary counter 30 starts operating on receiving preset data "1111" at preset data input terminals J1-J4 thereof. After reaching a count "1111", the binary counter 30 outputs a carry pulse C on the output terminal thereof in response a pulse input to the up-count input terminal U. On receiving the carry pule C at the preset enable input terminal PE, the binary counter 30 is again preset to "1111". Hence, when the pulse continuously arrives at the up-count input terminal U, the binary counter 30 outputs a carry pulse C in response to each pulse. Assume that two pulses, for example, are applied to the down-count input terminal D while the binary counter 30 is in such a condition. Then, the count changes from "1111" to "1101" by way of "1110". As the the binary counter 30 is restored to the input state to the up-count input terminal U, the count returns from "1101" to "1111" via "1110". In this manner, the binary counter 30 produces carry pulses C the number of which corresponds to the difference between the numbers of pulses applied to the input terminals U and D.

When the up-down counters 8 and 9 are each constituted by the binary counter 30 with a hysteresis characteristic, carry pulses C1 and C2 equal in number to the difference between the numbers of output carry pulses C and borrow pulses B from the cumulative adder 7 are obtained after the counters 8 and 9 have reached their overflow values.

Figure 4:
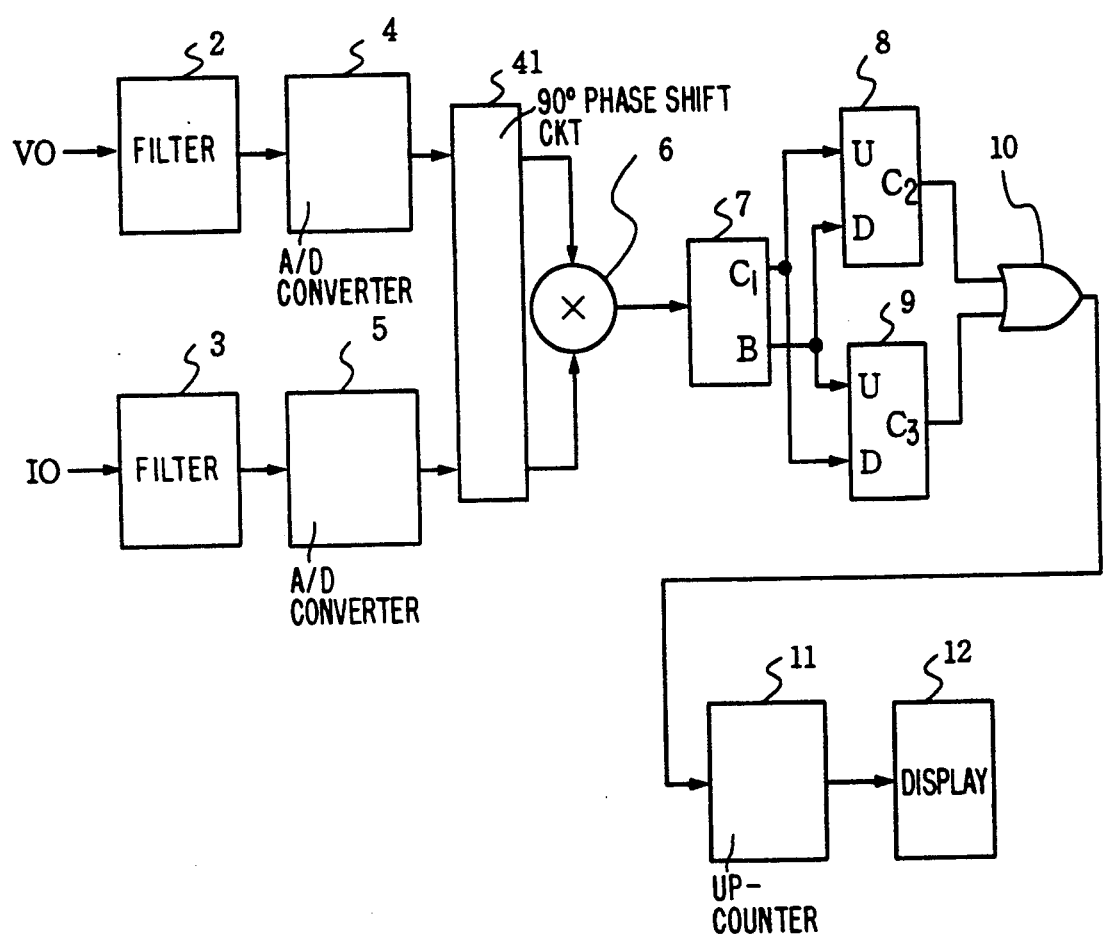
FIG. 4 is a block diagram schematically showing an alternative embodiment of the present invention.

Referring to FIG. 4, an alternative embodiment of the present invention will be described. In FIG. 4, the same components as the components shown in FIG. 1 are designated by the same reference numerals, and redundant description will be avoided for simplicity. As shown, a 90° phase shift circuit 41 is connected to the output terminals of the A/D converters 4 and 5, in contrast with the 90° phase shift circuit 1 of FIG. 1. The 90° phase shift circuit 41 can be implemented as a digital integrated circuit dealing with digitized signals and is, therefore, feasible for miniaturization, while the 90° phase shift circuit 1 needs various components for handling analog signals, e.g., coils and capacitors and is not desirable from the miniaturization standpoint.

Figure 5:
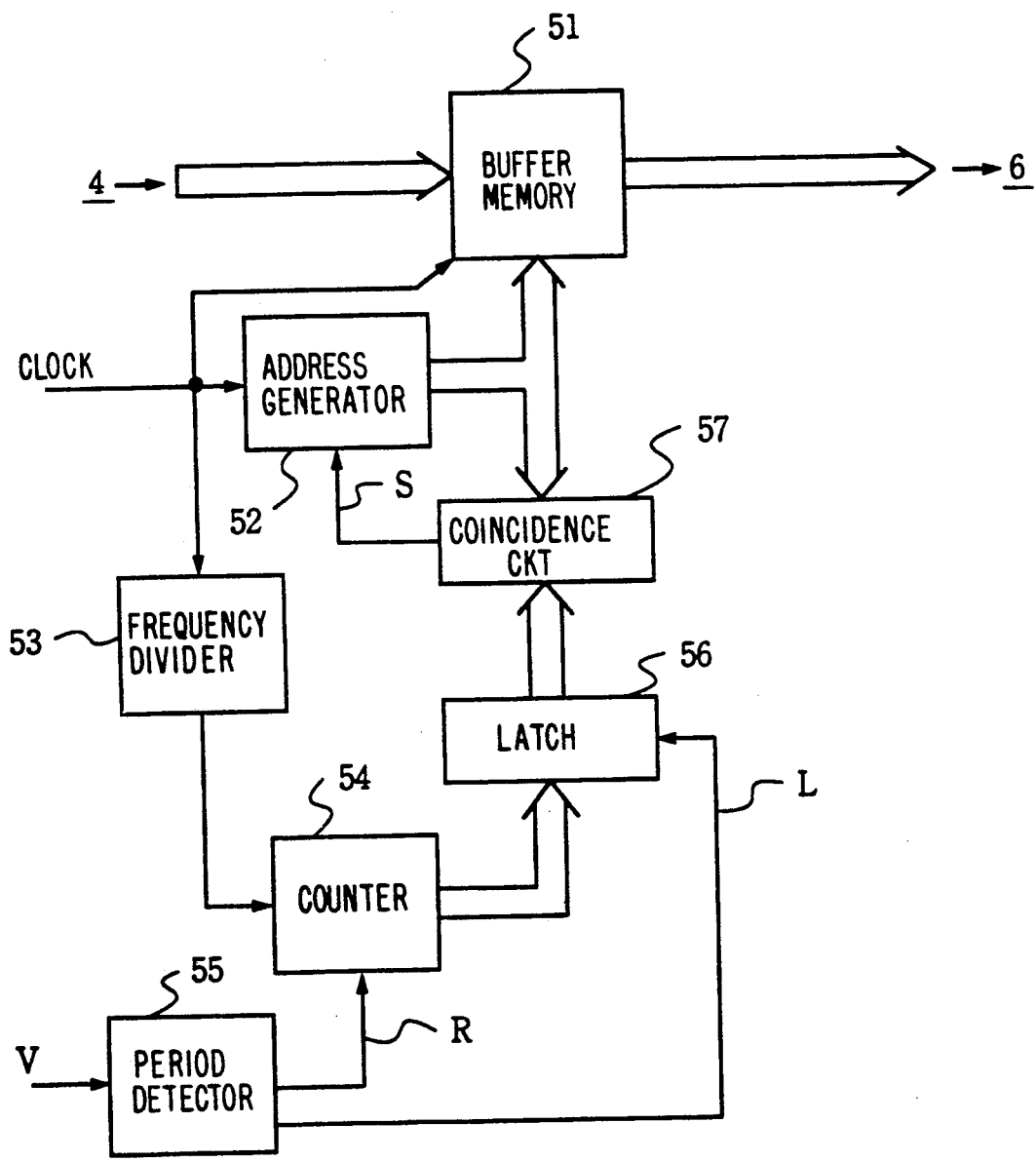
FIG. 5 is a block diagram schematically showing a specific construction of a 90° phase shift circuit included in the embodiment of FIG. 4.

As shown in FIG. 5 specifically, the 90° phase shift circuit 41 includes a buffer memory 51 for temporarily storing the digital signal from the A/D converter 4 which is representative of an AC waveform. The 90° phase shift circuit 41 reads the digital signal out of the buffer memory 51 at a timing delayed in phase by 90 degrees, thereby producing a digital signal representative of an AC waveform and shifted in phase by 90 degrees. To control the timing, use is made of the sampling clock of the A/D converter 4; the buffer memory 51 performs reading in the former half of each period of the clock and writing in the latter half of the same. A frequency divider 53 halves the frequency of the clock pulses and delivers the resulting clock pulses to a counter 54. A period detector 55 detects the zero-crossing timings of the AC waveform of the signal V shown in FIG. 4 and produces a pulse L which goes high every half a period of AC of the signal V and a pulse R which goes high just after the pulse L. The counter 54 up-counts the pulses from the frequency divider 53 and is reset to zero every time it receives the pulse R. A latch 56 receives the count of the counter 54 and, on receiving the pulse L, latches the count of the counter 54 and transfers it to a coincidence circuit 57. Therefore, the count transferred from the latch 56 to the coincidence circuit 57 is representative of the number of clock pulses having appeared within a period of time which is one-fourth of the period of the signal V, i.e., which corresponds to the phase of 90 degrees of the signal V.

An address generator 52 up-counts the clock pulses and is reset to zero every time it receives a pulse S from the coincidence circuit 57. The count of the address counter 52 is delivered to the buffer memory 51 and coincidence circuit 57. The coincidence circuit 57 produces the pulse S ever time the counts from the address generator 52 and latch 56 coincide. Therefore, the count of the address generator 52 is sequentially incremented from zero and is reset to zero every time one-fourth of the period of the signal V elapses. The buffer memory 51 accesses addresses thereof indicated by the incrementing count of the address generator 52 so as to read a digital signal out of each address and then write an input digital signal therein.

Operating in the above-described manner, the buffer memory 51 writes a digital signal from the A/D converter 4 therein and, on the elapse of a period of time corresponding to the phase of 90 degrees of the signal V, reads it out. As a result, a digital signal representative of an AC signal produced by shifting the phase of the signal V by 90 degrees is obtained.

To construct the 90° phase shift circuit 41, FIG. 4, the circuit of FIG. 5 is inserted in one of a pair of signal paths extending from the A/D converters 4 and 5 to the multiplier 6 while the other signal path is directly connected.

Although the invention has been described with reference to specific embodiments, this description is not meant to be construed in a limiting sense. Various modifications of the disclosed embodiments, as well as other embodiments of the present invention, will become apparent to persons skilled in the art upon reference to the description of the invention. It is, therefore, contemplated that the appended claims will cover any modifications or embodiments as fall within the true scope of the invention.

I claim:

1. A reactive volt-ampere-hour meter comprising:
    a 90-degrees phase shift circuit for receiving a first and a second electric signal representative of, respectively, an AC voltage and an AC current fed to a load and generating a pair of electric signals by shifting the phase of either of said first and second electric signals by 90 degrees;
    a multiplier for multiplying said pair of electric signals to thereby produce a third electric signal representative of a product of said pair of electric signals;
    a cumulative adder for cumulatively adding the third electric signals and generating a first carry pulse when the cumulative sum reaches a predetermined upper limit or generating a borrow pulse when said cumulative sum reaches a predetermined lower limit;
    a first up-down counter for up-counting the first carry pulses and down-counting the borrow pulses to generate a second carry pulse when the count of said first up-down counter reaches a predetermined value;
    a second up-down counter for up-counting said borrow pulses and down-counting said first carry pulses to generate a third carry pulse when the count of said second up-down counter reaches a predetermined value;
    an up-counter for up-counting said second and third carry pulses; and
    a display for displaying the count of said up-counter.

2. A meter as claimed in claim 1, wherein said cumulative adder comprises:
    a first integrating unit for cumulatively adding the third electric signals only when said third electric signals have positive values and generating said first carry pulse when the cumulative sum reaches said upper limit; and
    a second integrating unit for cumulatively adding said third electric signals only when said third electric signals have negative values and generating said borrow pulse when the cumulative sum reaches said predetermined lower limit.

3. A meter as claimed in claim 1, wherein said first and second up-down counters each comprises:
    input terminals for receiving preset data;
    a preset enable input terminal for receiving a command for forcibly setting the count to said preset data; and
    a connection line for delivering said second or third carry pulse generated by said up-down counter itself to said preset enable input terminal.

4. A meter as claimed in claim 1, wherein said first and second electric signals comprise analog signals, said meter further comprising between said 90-degrees phase shift circuit and said multiplier a first and a second filter for substantially removing needless frequency components from said pair of electric signals output by said 90-degrees phase shift circuit, and a first and a second analog-to-digital (A/D) converter for converting respectively output signals of said first and second filters to digital signals and feeding said digital signals to said multiplier.

5. A meter as claimed in claim 1, further comprising at a stage preceding said 90-degrees phase shift circuit a first and a second filter for substantially removing needless components from said two electric signals representative of the AC voltage and said AC current fed to the load, and a first and a second A/D converter for converting respectively the output signals of said first and second filters to digital signals and delivering said digital signals to said 90-degrees phase shift circuit as said first and second electric signals.

6. A meter as claimed in claim 5, wherein said 90-degrees phase shift circuit comprises:
    a phase shift circuit comprising a period detector for detecting the period of one of said two electric signals, a frequency divider for dividing a timing clock of said digital signals to thereby generate frequency divided output pulses, a counter for counting said frequency divided output pulses and resetting the count in response to an output signal of said period detector to thereby generate a first address signal representative of the number of pulses of said timing clock which are included in one-fourth of the period of said one electric signal, a coincidence circuit for comparing a second address signal representative of an address to access and said first address signal and, when said first and second address signals coincide, generating a coincidence pulse, an address generator for counting the pulses of said timing clock and resetting the count in response to said coincidence pulse to thereby generate a signal representative of said count as said second address signal, and a buffer memory for receiving one of said first and second electric signals to read, during the former half of an access period to an address indicated by said second address signal, the content of said address and write the received electric signal during the latter half of said access period; and a connection line for directly conducting the other one of said first and second electric signals.

* * * * *